US010685859B2

(12) United States Patent
Koshimizu et al.

(10) Patent No.: US 10,685,859 B2
(45) Date of Patent: Jun. 16, 2020

(54) PLASMA PROCESSING APPARATUS

(71) Applicant: TOKYO ELECTRON LIMITED, Tokyo (JP)

(72) Inventors: Chishio Koshimizu, Nirasaki (JP); Tatsuo Matsudo, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 148 days.

(21) Appl. No.: 15/685,342

(22) Filed: Aug. 24, 2017

(65) Prior Publication Data

US 2018/0061681 A1 Mar. 1, 2018

(30) Foreign Application Priority Data

Aug. 31, 2016 (JP) ................................ 2016-169503

(51) Int. Cl.
| | |
|---|---|
| C23C 16/00 | (2006.01) |
| H01L 21/00 | (2006.01) |
| H01L 21/67 | (2006.01) |
| H01J 37/32 | (2006.01) |
| H05H 1/46 | (2006.01) |

(52) U.S. Cl.
CPC .. *H01L 21/67103* (2013.01); *H01J 37/32027* (2013.01); *H01J 37/32119* (2013.01); *H01J 37/32174* (2013.01); *H01J 37/32357* (2013.01); *H01J 37/32422* (2013.01); *H01J 37/32651* (2013.01); *H05H 1/46* (2013.01)

(58) Field of Classification Search
CPC .................. H01J 37/321; H01J 37/3211; H01J 37/32119; H01J 37/32128; H01J 37/32137; H01J 37/32146; H01J 37/32155; H01J 37/32165; H01J 37/32174; H01J 37/32183; H01J 37/32623; H01J 37/32633; H01J 37/32651

See application file for complete search history.

(56) References Cited

U.S. PATENT DOCUMENTS

| | | | |
|---|---|---|---|
| 6,422,173 B1 * | 7/2002 | Nakajima ............. | H01J 37/321 118/723 AN |
| 6,592,710 B1 * | 7/2003 | Benjamin ............. | H01J 37/321 118/723 AN |
| 2014/0302678 A1 * | 10/2014 | Paterson ............. | H01L 21/3065 438/700 |

FOREIGN PATENT DOCUMENTS

| | | |
|---|---|---|
| CN | 1422434 A | 6/2003 |
| CN | 102737948 A | 10/2012 |
| JP | 10508985 A1 | 9/1998 |
| JP | 2011233924 A | 11/2011 |
| JP | 2014-209622 A | 11/2014 |
| KR | 2002-0089172 A | 11/2002 |
| KR | 10-2009-0109485 A | 10/2009 |
| WO | 2006/129643 A1 | 12/2006 |

* cited by examiner

*Primary Examiner* — Luz L Alejandro Mulero
(74) *Attorney, Agent, or Firm* — Nath, Goldberg & Meyer; Jerald L. Meyer

(57) ABSTRACT

There is provided a plasma processing apparatus, including: a chamber main body; a plasma trap installed inside a chamber provided by the chamber main body, and configured to divide the chamber into a first space and a second space; a mounting table installed in the second space; a plasma source configured to excite gases supplied to the first space; and a potential adjustment part including an electrode to be capacitively coupled to a plasma generated in the first space, and configured to adjust a potential of the plasma.

1 Claim, 4 Drawing Sheets

PLASMA PROCESSING APPARATUS

CROSS-REFERENCE TO RELATED APPLICATION

This application is based upon and claims the benefit of priority from Japanese Patent Application No. 2016-169503, filed on Aug. 31, 2016, the entire contents of which are incorporated herein by reference.

TECHNICAL FIELD

The present disclosure relates to a plasma processing apparatus.

BACKGROUND

In manufacturing electronic devices such as semiconductor devices, a plasma processing apparatus is used. In general, such a plasma processing apparatus includes a chamber main body, a mounting table and a plasma source. The chamber main body provides its internal space as a chamber. The mounting table is configured to hold a target object mounted thereon. The plasma source supplies the energy into the chamber to excite a gas supplied into the chamber. In the plasma processing apparatus, the target object is processed by active species such as ions and/or radicals from the plasma generated inside the chamber.

In a plasma process, there may be a case where the irradiation of the ions onto the target object is suppressed to prevent any damage to the target object due to the ions or to form a desired shape on the target object. For such a plasma process, there is generally known a plasma processing apparatus with a plasma trap installed within a chamber.

In a plasma processing apparatus provided with a plasma trap, a target object is processed substantially by radicals capable of passing through the plasma trap. However, there is a demand for implementing a process of the target object with only radicals as well as a process of the target object with the ions having various energies in a single plasma processing apparatus. In other words, there is a need for a plasma processing apparatus having the good controllability of the ion energy for a target object.

SUMMARY

Some embodiments of the present disclosure provide a plasma processing apparatus having the good controllability of the ion energy for a target object.

According to one embodiment of the present disclosure, there is provided a plasma processing apparatus, including: a chamber main body; a plasma trap installed inside a chamber provided by the chamber main body, and configured to divide the chamber into a first space and a second space; a mounting table installed in the second space; a plasma source configured to excite gases supplied to the first space; and a potential adjustment part including an electrode to be capacitively coupled to a plasma generated in the first space, and configured to adjust a potential of the plasma.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
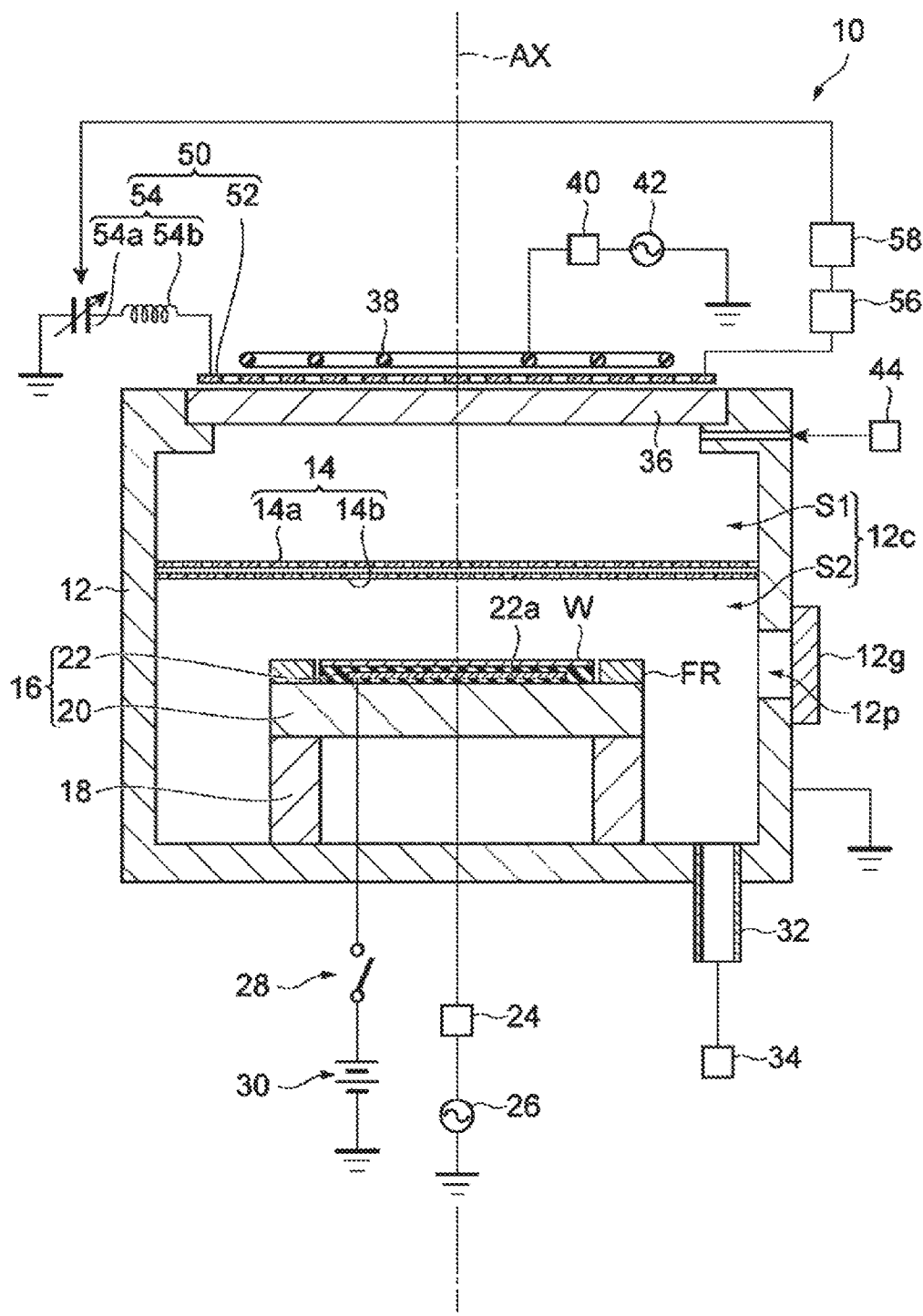
FIG. 1 is a view schematically showing a plasma processing apparatus according to one embodiment of the present disclosure.

Reference will now be made in detail to various embodiments, examples of which are illustrated in the accompanying drawings. Like or corresponding elements will be designated by like reference numerals throughout the respective figures. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

FIG. 1 is a view schematically showing a plasma processing apparatus according to one embodiment of the present disclosure. A plasma processing apparatus 10 shown in FIG. 1 is an inductively coupled plasma processing apparatus. The plasma processing apparatus 10 includes a chamber main body 12. The chamber main body 12 is formed of, for example, a conductive material such as aluminum and is grounded. In one embodiment, the chamber main body 12 has a substantially cylindrical shape. A central axis line of the chamber main body 12 is approximately coincided with an axis line AX extending in a vertical direction. The chamber main body 12 has an internal space as a chamber 12c.

A plasma trap 14 is installed inside the chamber 12c. The plasma trap 14 is installed in the middle of the chamber 12c in the vertical direction to divide the chamber 12c into a first space S1 and a second space S2. The first space S1 is a space included in the chamber 12c and defined above the plasma trap 14. The second space S2 is a space included in the chamber 12c and defined below the plasma trap 14. The plasma trap 14 prevents or suppresses the introduction of the plasma generated in the first space S1 into the second space S2. The plasma trap 14 includes one or more substantially plate-shaped members. A plurality of openings (through holes), for example, a plurality of slits is formed in the plasma trap 14. The plasma trap 14 may be formed of a dielectric material such as quartz but is not limited thereto. The plasma trap 14 is supported by the chamber main body 12.

In one embodiment, the plasma trap 14 includes two substantially plate-shaped members 14a and 14b. The members 14a and 14b are slightly spaced apart from each other and extend in a substantially horizontal direction. The member 14a extends above member 14b. The aforementioned plurality of openings are formed in both of the members 14a and 14b. In one embodiment, the plurality of openings formed in the member 14a is offset relative to the plurality of openings formed in the member 14b in a direction orthogonal to the axis line AX. In some embodiments, the plasma trap 14 may be composed of only a single member such as the member 14a or 14b.

A mounting table 16 is installed below the plasma trap 14 in the second space S2. The mounting table 16 is supported by a support body 18. The support body 18 is formed of an insulating material and has a substantially cylindrical shape. The support body 18 extends upward from a bottom of the chamber main body 12. The support body 18 supports the mounting table 16 at an upper end thereof. The mounting table 16 is configured to hold a target object W loaded into the second space S2. In addition, the target object W may have a disk shape like a wafer.

In one embodiment, the mounting table 16 has a lower electrode 20 and an electrostatic chuck 22. The lower electrode 20 is formed of a conductive material such as aluminum and has a substantially disk-like shape. In one embodiment, a high-frequency power supply 26 is coupled to the lower electrode 20 via a matching device 24. The high-frequency power supply 26 generates a high-frequency to be supplied to the lower electrode 20. Such a high-frequency has a frequency suitable for attracting the ions to the target object W. The high-frequency may have a frequency of, for example, 13.56 MHz or less. The matching device 24 includes a matching circuit for taking an impedance matching between the high-frequency power supply 26 and a load (the chamber main body 12). In some embodiments, the lower electrode 20 may not be connected to the high-frequency power supply 26 but may be grounded.

The electrostatic chuck 22 is installed on the lower electrode 20. The electrostatic chuck 22 includes a film-like electrode 22a incorporated in a disk-shaped insulating layer. A DC power supply 30 is coupled to the electrode 22a via a switch 28. If a voltage is applied from the DC power supply 30 to the electrode 22a, the electrostatic chuck 22 generates an electrostatic force. By virtue of this electrostatic force, the electrostatic chuck 22 holds the target object W placed thereon. A focus ring FR is disposed around the electrostatic chuck 22 and on the lower electrode 20 so as to surround an edge of the target object W. In some embodiments, the mounting table 16 may not include the electrostatic chuck 22.

An opening 12p communicating with the second space S2 is formed in a sidewall of the chamber main body 12. The opening 12p is an opening used for loading and unloading the target object W into and from the second space S2. The opening 12p is configured to be opened and closed by a gate valve 12g.

A pipeline 32 is connected to the bottom of the chamber main body 12 so as to allow the pipeline 32 to communicate with the second space S2. The pipeline 32 is connected to an exhaust device 34 installed outside the chamber main body 12. The exhaust device 34 includes a pressure regulating valve, and a vacuum pump such as a turbo molecular pump and/or a dry pump. The chamber 12c is configured to be depressurized by the exhaust device 34.

An opening is formed at an upper end portion of the chamber main body 12. This opening is closed by a dielectric window 36. The dielectric window 36 is installed between an antenna 38 to be described later and the first space S1, and defines the first space S1 from the above. The dielectric window 36 is made of, for example, a dielectric material such as quartz.

The antenna 38 is installed outside the chamber main body 12 and above the dielectric window 36. The antenna 38 is a coil and extends in a spiral shape about the axis line AX. A high-frequency power supply 42 is coupled to one end of the antenna 38 via a matching device 40. The other end of the antenna 38 is grounded. The high-frequency power supply 42 generates a high-frequency to be supplied to the antenna 38. A frequency of the high-frequency generated by the high-frequency power supply 42 is a frequency suitable for generating the plasma and may be a frequency higher than the frequency generated by the high-frequency power supply 26. The matching device 40 includes a matching circuit for taking an impedance matching between the high-frequency power supply 42 and a load (the chamber main body 12). Moreover, a combination of the antenna 38 and the high-frequency power supply 42 constitutes a plasma source according to one embodiment.

The plasma processing apparatus 10 further includes a gas supply part 44 configured to supply gases into the first space S1. The gas supply part 44 is configured to supply one or more gases from one or more gas sources to the first space S1 while controlling flow rates thereof. For example, the gas supply part 44 may include one or more flow controllers (for example, mass flow controllers or pressure-controlled flow controllers) and one or more valves.

In the plasma processing apparatus 10, the gases from the gas supply part 44 are supplied to the first space S1. Further, the chamber 12c is depressurized by the exhaust device 34. The high-frequency from the high-frequency power supply 42 is supplied to the antenna 38. The supply of the high-frequency to the antenna 38 generates an inductive magnetic field inside the first space S1. The gases inside the first space S1 are excited by virtue of the inductive magnetic field. As a result, the plasma is generated inside the first space S1. The target object W placed on the mounting table 16 is processed by active species obtained from the plasma thus generated.

The plasma processing apparatus 10 further includes a potential adjustment part 50. The potential adjustment part 50 includes an electrode 52 and an impedance adjustment circuit 54. The electrode 52 is formed of a conductive material. The electrode 52 is installed outside (at the atmosphere side) the chamber main body 12 and is configured to be capacitively coupled with the plasma generated in the first space S1. In some embodiments, the electrode 52 may be installed between the antenna 38 and the dielectric window 36, inside the dielectric window 36, or in the first space S1 (plasma chamber).

In this embodiment, the electrode 52 is a Faraday shield. In this embodiment, the electrode 52 is formed in a substantially plate-shape. The electrode 52 is installed between the antenna 38 and the dielectric window 36 and extends in a substantially horizontal direction. In addition, it is desirable that the antenna 38 and the Faraday shield are not in direct contact with each other. The electrode 52 has a plurality of openings formed therein. The plurality of openings of the electrode 52 is formed to penetrate the electrode 52 in a thickness direction. Furthermore, the plurality of openings formed in the electrode 52 is arranged in a circumferential direction around the axis line AX while extending, for example, in a radial direction with respect to the axis line AX.

A high-frequency is generated at the electrode 52 by the high-frequency supplied from the high-frequency power supply 42 to the antenna 38. The impedance adjustment circuit 54 is installed between the electrode 52 and the ground. The impedance adjustment circuit 54 adjusts impedance between the electrode 52 and the ground. Accordingly, a peak value Vpp of a voltage of the high-frequency generated in the electrode 52 is adjusted. The impedance adjustment circuit 54 includes a variable reactance element. In one embodiment, the impedance adjustment circuit 54 includes a variable capacitance capacitor 54a as the variable reactance element. In addition, the impedance adjustment circuit 54 further includes a coil 54b. The coil 54b and the variable capacitance capacitor 54a are connected in series between the electrode 52 and the ground. A circuit configuration of the impedance adjustment circuit 54 may be implemented in various modes as long as the impedance between the electrode 52 and the ground can be adjusted.

In one embodiment, the potential adjustment part 50 may further include a detector 56 and a control part 58. The detector 56 is connected to the electrode 52. The detector 56 detects the peak value Vpp of the high-frequency voltage generated at the electrode 52. The detector 56 may be, for example, a high-voltage probe.

The peak value detected by the detector 56 is inputted to the control part 58. The control part 58 is configured to hold a predetermined relationship between the energy of the ions incident onto the target object W and the peak value Vpp of the voltage generated at the electrode 52. Such a relationship y be held in the form of a table or function. The control part 58 refers to the relevant relationship to obtain a peak value of the voltage at the electrode 52, which corresponds to a set value of the energy of the inputted ions. The control part 58 controls the variable reactance element of the impedance adjustment circuit 54 so as to reduce a difference between the obtained peak value and the peak value Vpp detected by the detector 56. In other words, the control part 58 controls, for example, an electrostatic capacitance of the variable capacitance capacitor 54a of the impedance adjustment circuit 54 so that the peak value Vpp detected by the detector 56 becomes the preset peak value Vpp.

In some embodiments, instead of the peak value Vpp of the voltage, a self-bias potential Vdc or an ion energy may be used. In other words, in a case where the plasma processing apparatus 10 is configured to apply a bias voltage to the lower electrode 20 or in a case where the plasma processing apparatus 10 has a configuration in which the impedance adjustment circuit 54 is connected to the lower electrode 20, a relationship between the energy of the ions corresponding to the electrostatic capacitance of the variable capacitance capacitor 54a and the Vdc of the focus ring FR (or the lower electrode 20) detected by the detector may be obtained in advance. The control part 58 may refer to the relevant relationship so as to obtain the Vdc corresponding to the inputted energy of the ions. The control part 58 may control the electrostatic capacitance of the variable capacitance capacitor 54a so as to reduce a difference between the obtained Vdc and the Vdc detected by the detector. Alternatively, the detector may detect the energy of the ions, and the control part 58 may control the variable reactance element of the impedance adjustment circuit 54 so as to reduce a difference between the inputted energy of the ions and the detected energy of the ions.

In one embodiment, the control part 58 may be a computer apparatus including a processor, a storage device such as a memory, a display and an input device such as a keyboard. The aforementioned relationship prepared in the form of a table or function is stored as data in the storage device. The processor refers to the relevant relationship so as to obtain the peak value of the voltage at the electrode 52, which corresponds to the set value of the energy of the ions which is inputted through the input device. The processor controls, for example, the electrostatic capacitance of the variable capacitance capacitor 54a of the impedance adjustment circuit 54 so that the peak value Vpp detected by the detector 56 becomes the preset peak value Vpp.

The control part 58 may control respective parts of the plasma processing apparatus 10 in the plasma process performed in the plasma processing apparatus 10. In this case, a control program and recipe data are stored in the storage device of the control part 58. The processor of the control part 58 is operated according to the control program and the recipe data, thereby controlling the respective parts of the plasma processing apparatus 10.

In the plasma processing apparatus 10, the potential of the plasma generated in the first space S1 can be arbitrarily changed in a range from a low potential to a high potential by the potential adjustment part 50. When the potential of the plasma is set to a low potential, the supply of the ions from the first space S1 to the second space S2 is inhibited or suppressed. Thus, the target object W is processed by radicals that can pass through the plasma trap 14. Meanwhile, when the potential of the plasma is set to a high potential, the ions pass through the plasma trap 14 from the first space S1 and are then supplied to the second space S2. Therefore, it is possible to process the target object W with the ions. In addition, by adjusting the potential of the plasma within a relatively high potential range, it is possible to adjust the energy of the ions incident onto the target object W. Accordingly, the plasma processing apparatus 10 is excellent in controllability of the ion energy for the target object W.

Figure 2:
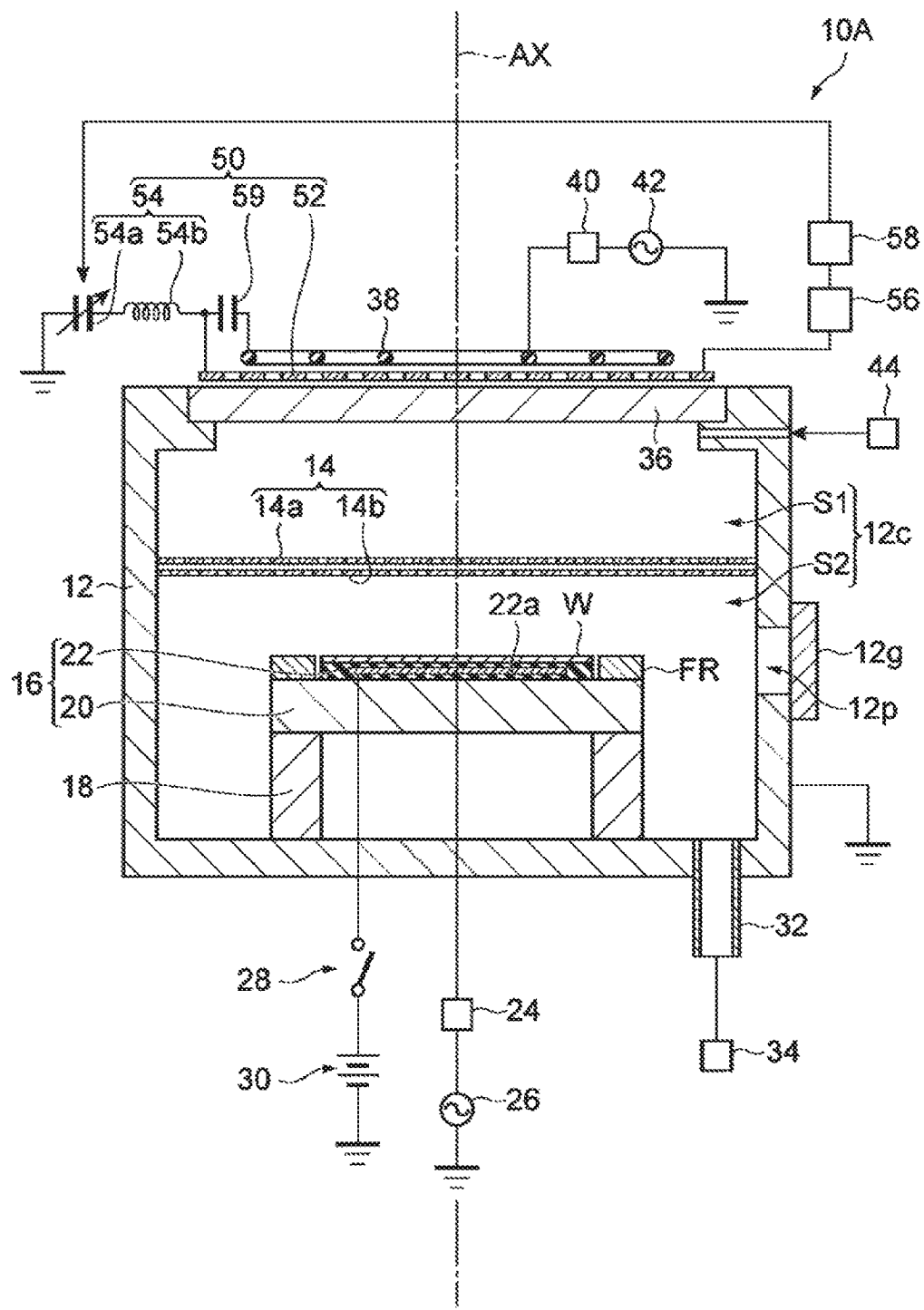
FIG. 2 is a view schematically showing a plasma processing apparatus according to another embodiment of the present disclosure.

Next, a plasma processing apparatus according to another embodiment will be described. FIG. 2 is a view schematically showing a plasma processing apparatus according to another embodiment of the present disclosure. A plasma processing apparatus 10A shown in FIG. 2 is different from the plasma processing apparatus 10 in that the potential adjustment part 50 further includes a capacitor 59.

One end of the capacitor 59 is connected to the antenna 38. In one embodiment, the capacitor 59 is connected to an intermediate portion between one end and the other end of the antenna 38. The other end of the capacitor 59 is connected to the electrode 52. In one embodiment, the other end of the capacitor 59 is connected to a node between the electrode 52 and the impedance adjustment circuit 54.

In the plasma processing apparatus 10, the antenna 38 and the electrode 52 are capacitively coupled to each other, and a high-frequency is supplied to the antenna 38 so that a high-frequency is generated in the electrode 52. Meanwhile, the plasma processing apparatus 10A is configured such that a voltage of the high-frequency which is supplied to the antenna 38 and is then capacitively divided by the capacitor 59 is applied to the electrode 52. Even in this plasma processing apparatus 10A, the potential of the plasma in the first space S1 can be adjusted by the potential adjustment part 50, which makes it possible to control the energy of the ions with respect to the target object W.

Figure 3:
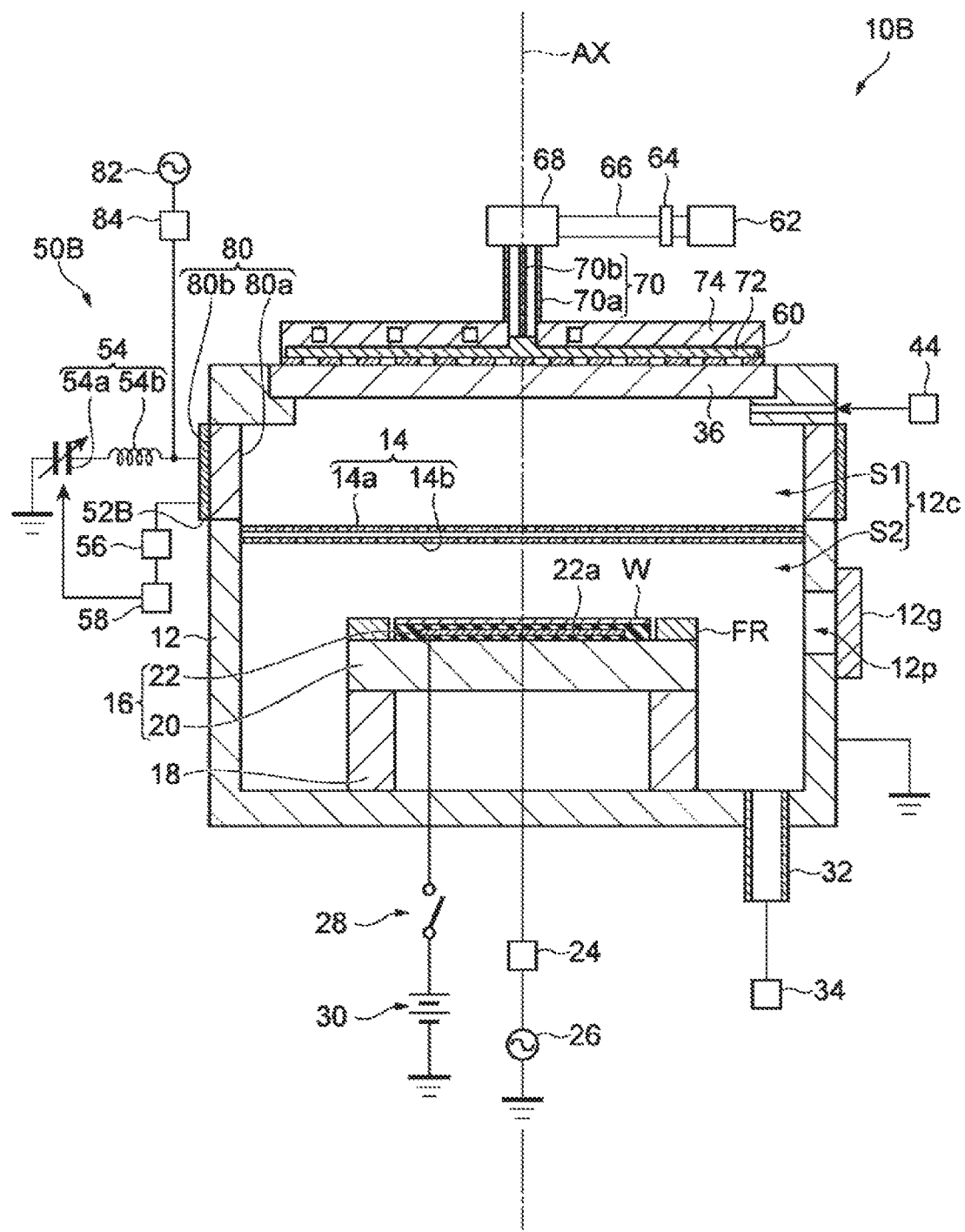
FIG. 3 is a view schematically showing a plasma processing apparatus according to yet another embodiment of the present disclosure.

Next, a plasma processing apparatus according to yet another embodiment will be described. FIG. 3 is a view schematically showing a plasma processing apparatus according to yet another embodiment of the present disclosure. A plasma processing apparatus 10B shown in FIG. 3 includes a plasma source different from those of the plasma processing apparatuses 10 and 10A. The plasma source of the plasma processing apparatus 10B is configured to generate the plasma using the microwave. A difference between the plasma processing apparatus 10B and the plasma processing apparatus 10 will be described below.

The plasma processing apparatus 103 includes an antenna 60 and a microwave generator 62. The antenna 60 is installed on the dielectric window 36. The antenna 60 has a substantially flat plate shape and is formed of a conductive material. A plurality of slot holes is formed in the antenna 60 such that they penetrate through the antenna 60 in a thickness direction thereof. The microwave from the microwave generator 62 is supplied to the antenna 60. A frequency of the microwave generated by the microwave generator 62 is a frequency in a gigahertz band and is, for example, 2.45 GHz. The microwave supplied to the antenna 60 is introduced into the first space S1 from the plurality of slot holes formed in the antenna 60 via the dielectric window 36. The microwave introduced into the first space S1 excites the gases supplied to the first space S1. As a result, the plasma is generated in the first space S1.

In one embodiment, the antenna 60 may be a radial line slot antenna. A plurality of pairs of slot holes is formed in the antenna 60 that is the radial line slot antenna. The plurality of pairs of slot holes is arranged along one circle or a plurality of concentric circles centered at the axis line AX. Each of the plurality of pairs of slot holes includes two slot holes. The two slot holes are long holes extending in a direction in which the two slot holes are orthogonal to or intersect each other, and penetrate through the antenna 60 in the thickness direction.

In the embodiment in which the antenna 60 is the radial line slot antenna, the plasma processing apparatus 10B may further include a tuner 64, a waveguide 66, a mode converter 68, a coaxial waveguide 70, a dielectric plate 72 and a cooling jacket 74. The microwave generator 62 is coupled to an upper end portion of the coaxial waveguide 70 via the tuner 64, the waveguide 66 and the mode converter 68. The coaxial waveguide 70 includes an outer conductor 70a and an inner conductor 70b. The outer conductor 70a has a tubular shape. A central axis line of the outer conductor 70a is approximately coincided with the axis line AX. The inner conductor 70b is installed inside the outer conductor 70a and extends on the axis line AX. A lower end portion of the outer conductor 70a is connected to the cooling jacket 74 having a conductive surface. A lower end portion of the inner conductor 70b is connected to the antenna 60. The dielectric plate 72 is installed between the antenna 60 and the cooling jacket 74. The dielectric plate 72 has a function of shortening the wavelength of the microwave propagating in the dielectric plate 72.

The microwave generated by the microwave generator 62 propagates to the ode converter 68 via the tuner 64 and the waveguide 66. In the mode converter 68, a mode of the microwave is converted. The microwave of which the mode has been converted is supplied to the antenna 60 via the coaxial waveguide 70 and the dielectric plate 72. As described above, the microwave supplied to the antenna 60 is introduced into the first space S1 from the plurality of slot holes of the antenna 60 via the dielectric window 36 so as to excite the gases in the first space S1.

In the plasma processing apparatus 10B, the sidewall defining the first space S1 of the chamber main body 12 is at least partially constructed by a window 80. The window 80 is formed of a dielectric material such as quartz. The window 80 extends in the circumferential direction around the axis line AX. In one embodiment, the window 80 may have a substantially cylindrical shape. An inner surface 80a of the window 80 (positioned at the axis line AX side) is in contact with the first space S1. An outer surface 80b opposite to the inner surface 80a in the window 80 faces outside the chamber main body 12.

The plasma processing apparatus 10B includes a potential adjustment part 50B. Similarly to the potential adjustment part 50, the potential adjustment part 50B includes the impedance adjustment circuit 54, the detector 56 and the control part 58. The potential adjustment part 50B further includes an electrode 52B and a high-frequency power supply 82.

The electrode 52B is an electrode which is to be capacitively coupled with the plasma generated in the first space S1. The electrode 52B is installed outside the chamber main body 12 and extends along the outer surface 80b of the window 80. In order to detect the peak value of the voltage of the high-frequency at the electrode 52B, the detector 56 is connected to the electrode 52B.

Furthermore, the impedance adjustment circuit 54 is connected to the electrode 52B. In addition, the high-frequency power supply 82 is coupled to the electrode 52B via a matching device 84. In one embodiment, the high-frequency power supply 82 is coupled to a node between the electrode 52B and the impedance adjustment circuit 54 via the matching device 84. The high-frequency power supply 82 generates a high-frequency. This high-frequency is to adjust the potential of the plasma and may have the same frequency as that of the high-frequency of the high-frequency power supply 42. The matching device 84 includes a matching circuit for taking an impedance matching between the high-frequency power supply 82 and the load.

Since the microwave is used for generating the plasma in the plasma processing apparatus 10B, the potential of the plasma cannot be adjusted using the high-frequency supplied to the antenna as in the inductively coupled plasma processing apparatuses 10 and 10A. Therefore, in the plasma processing apparatus 10B, the high-frequency power supply 82 is used to supply the high-frequency to the electrode 52B. In the plasma processing apparatus 10B, the potential of the plasma is adjusted by adjusting the peak value of the voltage of the high-frequency supplied from the high-frequency power supply 82. Accordingly, it is possible to control the energy of the ions with respect to the target object W. The electrode 52B may be installed in a ceiling plate such as the dielectric window 36.

Hereinafter, an experiment conducted for evaluating the plasma processing apparatus 10 will be described. In this experiment, the energy of the ions irradiated onto the mounting table 16 and an ion current at the mounting table 16 were obtained by using the peak value Vpp of the voltage at the electrode 52 as a variable parameter. In addition, the peak value Vpp was changed by adjusting the capacitance of the variable capacitance capacitor 54a. Various settings in the experiment are shown below.

Figure 4:
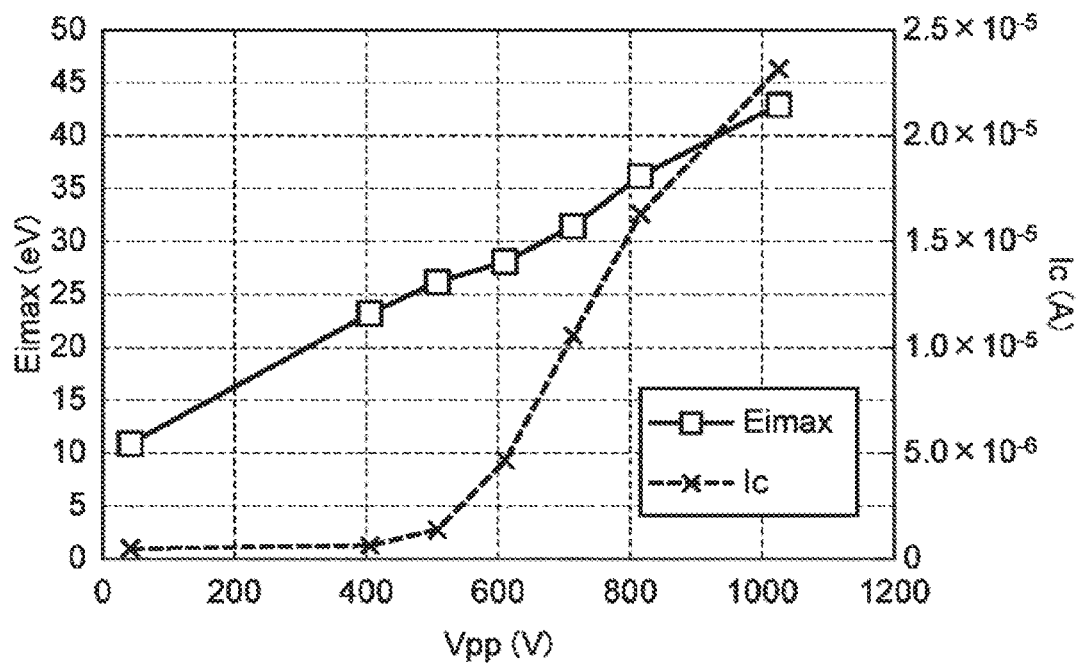
FIG. 4 is a graph representing an experimental result.

<Setting in Experiment>
Gas supplied into the first space
  $O_2$ gas: 300 sccm
  Ar gas: 10 sccm
High-frequency power of the high-frequency power supply 42: 650 W
Frequency of high-frequency of the high-frequency power supply 42: 13.56 MHz
Gap length between the dielectric window 36 and the mounting table 16: 135 mm
The number of members of the plasma trap 14: 1 sheet
Gap length between the dielectric window 36 and the plasma trap 14: 70 mm FIG. 4 shows a graph of results of the experiment. In the graph of FIG. 4, a horizontal axis represents the peak value Vpp of the voltage at the electrode 52, a left vertical axis represents a maximum value Eimax of the ion energy, and a right vertical axis represents the ion current Ic. As shown in FIG. 4, it was found that the maximum value Eimax increases with the increase in the peak value Vpp of the electrode 52. Further, when the peak value Vpp of the electrode 52 was at a level of 400V, the ion current was approximately zero. That is to say, it was found that when the peak value Vpp of the electrode 52 was at a level of 400 V, the ions hardly reached the mounting table 16 and the radicals mainly reached the mounting table 16. Furthermore, when the peak value Vpp of the electrode 52 was increased in a range of 400 V or more, the ion current was increased with the increase. Therefore, it was found that when the peak value Vpp at the electrode 52 becomes a certain value or more, the ions passed through the plasma trap 14 and were introduced into the second space S2. Moreover, it was found that the energy of the ions could be increased with the increase of the peak value Vpp in a range above a certain value. That is to say, it was found that the energy of the ions incident onto the target object W could be arbitrarily adjusted.

While various embodiments have been described above, various modifications may be made without being limited to the aforementioned embodiments. For example, although the plasma trap 14 has been described to be formed of a dielectric material, the plasma trap 14 may be formed of a conductive material. In the case where the plasma trap 14 is formed of a conductive material, the plasma trap 14 may not be grounded such that the ions properly pass through the plasma trap 14. The number of plate-shaped members constituting the plasma trap 14, the number of the openings formed in the plasma trap 14 and the sizes of the openings may be appropriately optimized according to gases to be used, a pressure in the chamber 12c, flow rates of the gases, high-frequency power for generating the plasma, and the like.

According to the present disclosure in some embodiments, it is possible to provide a plasma processing apparatus having the good controllability of the ion energy for a target object.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. An inductively coupled plasma processing apparatus comprising:
    a chamber main body;
    a plasma trap installed inside a chamber provided by the chamber main body, and configured to divide the chamber into a first space and a second space;
    a mounting table installed in the second space;
    a plasma source including an antenna connected to a high-frequency power supply, and configured to excite gases supplied to the first space;
    a dielectric window installed between the antenna and the first space; and
    a potential adjustment part configured to adjust a potential of a plasma generated in the first space,
    wherein the potential adjustment part includes:
        an electrode which is a Faraday shield installed between the antenna and the dielectric window, and is configured to be capacitively coupled to the plasma generated in the first space;
        an impedance adjustment circuit equipped with a variable reactance element and connected between the electrode and a ground;
        a detector configured to detect a peak value of a voltage at the electrode; and
        a control part configured to: store data representing a predetermined relationship between an energy of ions incident onto a target object mounted on the mounting table and the peak value of the voltage at the electrode; receive a target value of the energy of the ions incident onto the target object; obtain a target peak value of the voltage at the electrode, which corresponds to the target value of the energy of the ions, with reference to the stored data; and control the variable reactance element of the impedance adjustment circuit so as to reduce a difference between the target peak value and the detected peak value of the voltage at the electrode detected by the detector.

* * * * *